US009000496B1

(12) United States Patent
Bronecke et al.

(10) Patent No.: US 9,000,496 B1
(45) Date of Patent: Apr. 7, 2015

(54) SOURCE BRIDGE FOR COOLING AND/OR EXTERNAL CONNECTION

(75) Inventors: Peter N. Bronecke, Mt. Laurel, NJ (US); Raymond Albert Fillion, Niskayuna, NY (US); Joshua Isaac Wright, East Greenbush, NY (US); Jesse Berkley Tucker, Niskayuna, NY (US); Laura Jean Meyer, Schenectady, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 73 days.

(21) Appl. No.: 11/924,200

(22) Filed: Oct. 25, 2007

Related U.S. Application Data

(62) Division of application No. 11/180,471, filed on Jul. 13, 2005, now Pat. No. 7,303,947.

(51) Int. Cl.
*H01L 29/772* (2006.01)
*H01L 27/144* (2006.01)

(52) U.S. Cl.
CPC .................................... *H01L 27/144* (2013.01)

(58) Field of Classification Search
USPC ......... 257/272, 268, 270, 280, 281, 282, 297, 257/298, 684, 706, 707
See application file for complete search history.

(56) References Cited

U.S. PATENT DOCUMENTS

| | | | | |
|---|---|---|---|---|
| 4,974,039 A | * | 11/1990 | Schindler et al. | 257/277 |
| 5,162,258 A | * | 11/1992 | Lemnios et al. | 438/10 |
| 5,353,498 A | | 10/1994 | Fillion et al. | |
| 5,497,033 A | * | 3/1996 | Fillion et al. | 257/723 |
| 5,621,616 A | * | 4/1997 | Owens et al. | 361/704 |
| 6,153,473 A | * | 11/2000 | Calafut et al. | 438/268 |
| 6,306,680 B1 | | 10/2001 | Fillion et al. | |
| 2005/0077614 A1 | * | 4/2005 | Chengalva et al. | 257/706 |
| 2006/0049530 A1 | * | 3/2006 | Hsu | 257/784 |

OTHER PUBLICATIONS

Stanley Wolf, "Silicon Processing for the VLSI Era", vol. 2, pp. 236, 284, 299, 336, ISBN 0-961672-4-5, Lattice Press, 1990.*

* cited by examiner

*Primary Examiner* — Andy Huynh
*Assistant Examiner* — Sitaramarao S Yechuri
(74) *Attorney, Agent, or Firm* — Howard IP Law Group, PC

(57) ABSTRACT

A FET includes elongated, mutually parallel source regions separated by gate and drain regions. Conductive bridges extend over the gate and drain regions and not in electrical contact therewith to electrically and thermally interconnect the sources. A layer of dielectric is applied over surfaces, and an aperture is defined over the bridges. A thick layer of metal is applied over and in thermal and electrical contact with the bridges. Electrical and thermal connections can be made to the thick metal.

27 Claims, 14 Drawing Sheets

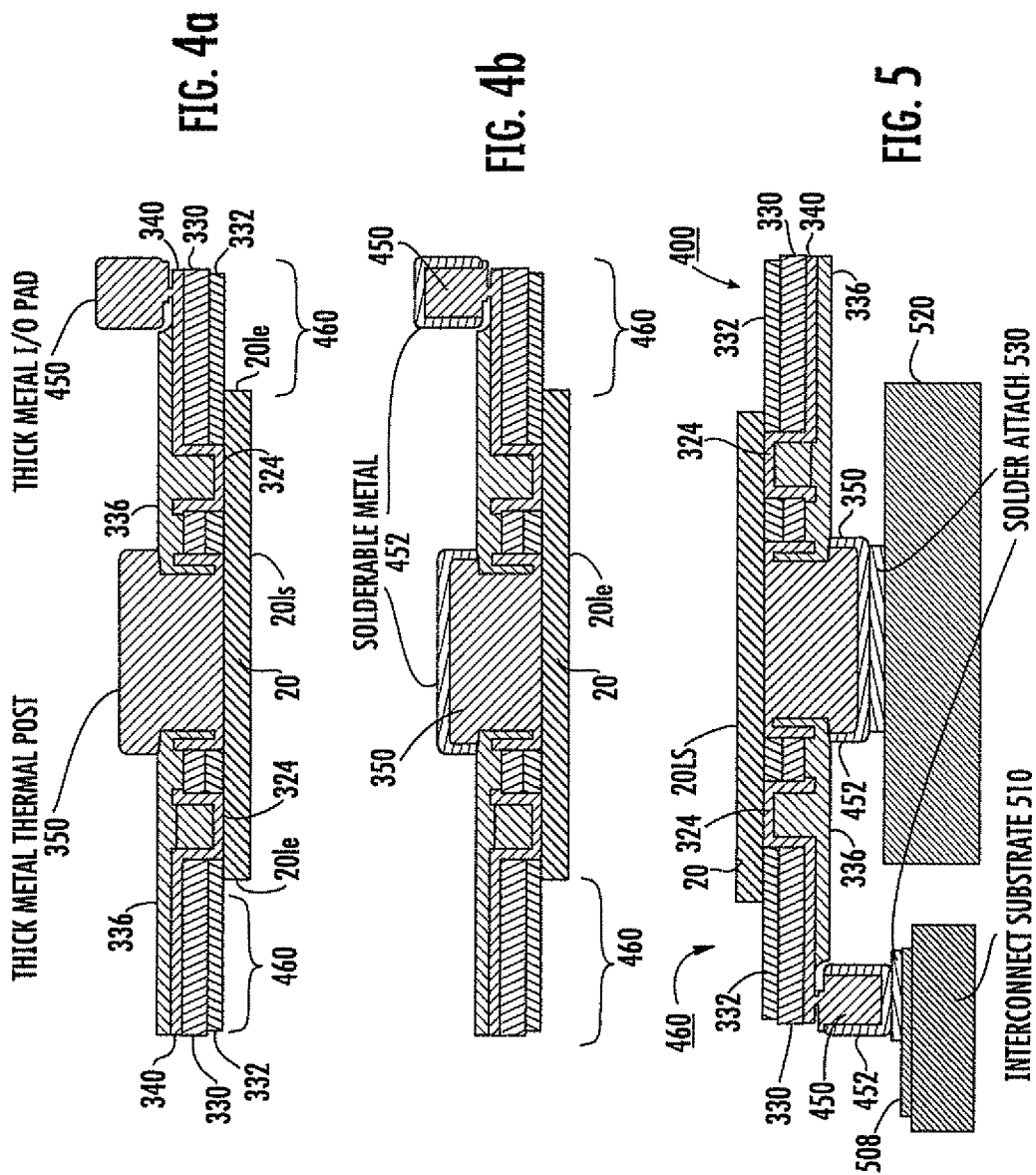

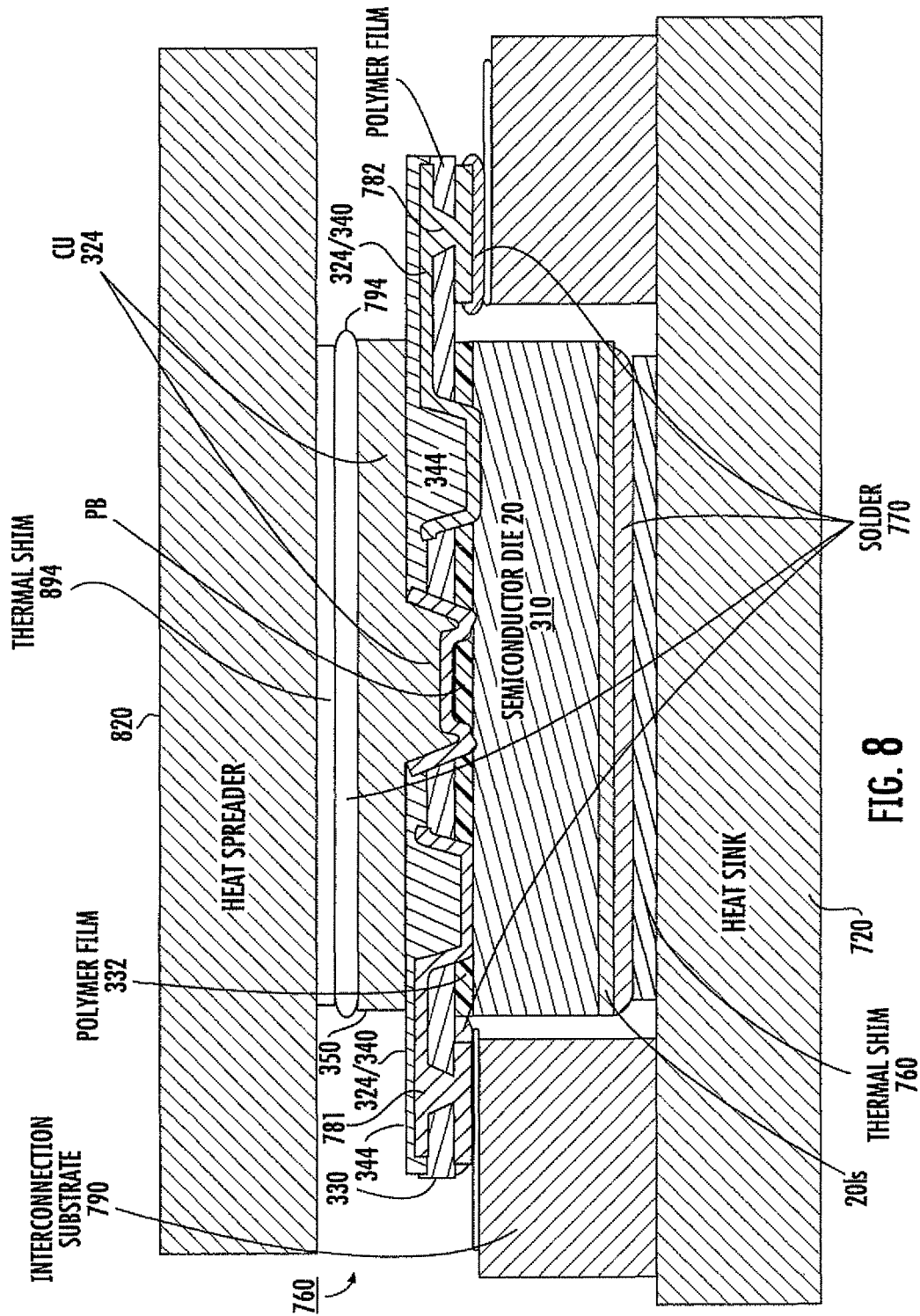

SOURCE BRIDGE FOR COOLING AND/OR EXTERNAL CONNECTION

RELATED APPLICATION

The present application is a divisional application of U.S. application Ser. No. 11/180,471, entitled SOURCE BRIDGE FOR COOLING AND/OR EXTERNAL CONNECTION, filed on Jul. 13, 2005, the entire disclosure of which is hereby incorporated by reference in its entirety.

FIELD OF THE INVENTION

This invention relates to the fabrication of solid-state devices and assemblies in a manner that provides effective heat removal.

BACKGROUND OF THE INVENTION

Wide Band Gap semiconductor microwave materials such as Silicon Carbide (SiC) and Gallium Nitride (GaN) have higher temperature capabilities than conventional non-wide-band-gap semiconductor materials such as silicon, germanium, or low voltage gallium arsenide (GaAs). Semiconductor devices made from wide band gap materials are capable of delivering an order of magnitude greater power than non-wide-band-gap devices. This greater delivered power is accompanied by a corresponding increase in on-chip dissipated power in the form of heat.

Traditional cooling methods and materials do not have the thermal performance required to maintain chip or junction temperatures sufficiently low for adequate reliability and device performance. A SiC MESFET can dissipate (generate and transfer away to an appropriate heat sink) 5 watts per mm of gate width by comparison with the 0.5 watts per mm in a good GaAs device.

Microwave devices are ordinarily cooled by heat transfer from the active portion of the semiconductor chip, which is typically on an active surface of the semiconductor, through the semiconductor chip, and through a chip or die attachment to an underlying physical structure. The underlying structure is preferably thermally conductive, and may be associated with either fins for heat transfer to the ambient air, or with channels for the flow of liquid coolant. The chip or die attachment may be subject to stresses attributable to mismatches in the coefficient of thermal expansion (CTE) between the chip or die and the underlying structure. This CTE mismatch may be ameliorated by mounting the chip by the use of gold-tin (Au:Sn) solder to a matched-CTE shim, and mounting of the shim to the underlying high-CTE structure by means of thermally conductive adhesive. As an alternative, the chip may be directly mounted to the underlying structure by means of thermally conductive adhesive. The thermally conductive adhesives are often loaded with thermally conductive particles, but nevertheless still do not have conductivity equivalent to that of conductive metals such as copper or silver. Thermally conductive adhesives may have thermal conductivity in the range of about 1.0 to 1.5° C./watt-cm. In a typical application, as much as 30% to 50% of the temperature rise (temperature difference between the active portion of the chip and the underlying structure) may be attributable to the mounting adhesive. The mounting adhesive is a limitation in the cooling of high-power semiconductor devices, whether they be of SiC construction, GaN, or low-voltage GaAs.

Various alternative mounting/cooling arrangements have been suggested for high power microwave devices. Such alternatives include flow-through liquid cooling, micro-heat-pipes, exotic interface materials, and thermoelectric coolers. None of these solutions has met with marked success or widespread usage. Because of the continuing issues associated with high power densities and lack of suitable cooling, some SiC microwave monolithic integrated circuits (MMIC) spread the FET fingers farther apart than the feature size limitations would otherwise require, thereby sacrificing some radio-frequency (RF) performance, but also decreasing the power density in watts/mm to a level which can be handled by the heat transfer mechanisms. The increase in the size of the finger spacing in turn results in a larger FET die size, which undesirably impacts the yield of good dies per semiconductor wafer.

Improved or alternative structures and manufacturing methods are desired for electrical and thermal control in microwave semiconductor arrangements.

SUMMARY OF THE INVENTION

A mode of a method according to an aspect of the invention is for making a microwave power device. The mode includes the step of procuring a microwave FET including an active surface bearing at least a gate electrode, a drain electrode, and at least first and second source electrodes separated by gate and drain electrodes. An electrically conductive bridge is thermally and electrically connected to the source electrodes, and extends over, but does not electrically contact, the gate or drain electrodes. This provides electrical communication between the first and second source electrodes. A sheet of dielectric material defining first and second broad sides is procured. The active side of the FET is affixed to the first broad side of the dielectric sheet, with the electrically conductive bridge facing the first broad side of the sheet of dielectric material. An electrically and thermally conductive through via is defined, extending through the dielectric sheet at least over the bridge. The through via makes electrical and thermal contact with at least the bridge, to produce electrical contacts adjacent or on the second side of the dielectric sheet providing access to, or accessing, the source electrodes of the FET, and also providing a thermal path from the bridge to the second side of the dielectric sheet.

In a particular version of the mode of the method, the step of making a bridge includes the step of applying dielectric material to the active surface of the device at a location lying between the first and second source electrodes, and applying a metal to the upper surface of the dielectric material. The step of applying dielectric material to the active surface of the device at a location lying between the first and second source electrodes may include the step of applying the dielectric material over at least a portion of the gate and drain electrodes.

In another mode of a method according to the invention, the device further comprises gate and drain electrodes, and the gate and drain electrodes are connected to gate and drain input/output electrodes, respectively, by conductive traces lying on the active surface of the device. In this mode, the step of affixing the active side of the FET to the first broad side of the dielectric sheet includes the step of affixing the active side of the FET to the first broad side of the dielectric sheet with the dielectric sheet overlying the gate and drain input/output electrodes. The mode further comprises the step of defining an electrically and thermally conductive additional through via extending through the dielectric sheet at least over one of the gate and drain input/output electrodes, for providing electrical contact to at least one input/output electrode.

Following the step of defining an electrically and thermally conductive additional through via extending through the dielectric sheet at least over one of the gate and drain input/ output electrodes, a layer of resist, such as solder resist, may be applied over at least the additional through via.

The step of defining an electrically and thermally conductive through via extending through the dielectric sheet at least over the bridge may include the further step of defining a through aperture extending from the first to the second side of the dielectric sheet, at least over the bridge, and plating metal onto the bridge and also onto the resist material overlying the additional through via. The step of plating metal may be performed until the resulting plated metal extends above the second broad surface of the dielectric sheet.

The method may include the additional step of making electrical contact on the second broad side of the dielectric sheet between the additional through via and a device other than the microwave power device.

The step of defining an electrically and thermally conductive through via extending through the dielectric sheet at least over the bridge may include the step of defining an aperture extending through the dielectric sheet at least over the bridge, and plating metal through the aperture onto the conductive bridge.

In a particularly advantageous method according to an aspect of the invention, an exposed surface of the electrically and thermally conductive through via is thermally coupled to a heat sink. In an even more advantageous mode of the method, the inactive surface is thermally coupled to a further heat sink.

A microwave circuit package according to an aspect of the invention comprises a microwave device having an active top surface and a non-active bottom surface. The active top surface includes plural source electrodes, plural gate electrodes mutually electrically interconnected by gate connection conductors lying on the active top surface, and plural drain electrodes mutually electrically interconnected by drain connection conductors lying on the active top surface. The package also includes a plurality of electrically conductive bridges physically and electrically fastened to, and electrically interconnecting the plural source electrodes. The bridges are electrically isolated from the gate and drain interconnection conductors and extend above the active top surface. A layer of dielectric film extends over at least that portion of the circuit package including the plurality of electrically conductive bridges and is physically connected to the circuit package. A thermally conductive through via extends through the layer of dielectric film at the locations of at least some of the electrically conductive bridges, whereby heat can be extracted from the circuit package by way of the thermally conductive via. The thermally conductive through via may also be electrically conductive.

In a circuit package further comprising gate and drain input/output electrodes electrically connected to the gate connection conductors and drain connection conductors, respectively, the additional electrically conductive through vias extend through the layer of dielectric film at locations overlying the gate and drain input/output electrodes, and make electrical connection thereto. The package may further comprise an electrical trace electrically connected to at least one of the gate and drain input/output electrodes and extending over a portion of the dielectric film to a location remote from the footprint of the microwave device.

BRIEF DESCRIPTION OF THE DRAWING

FIG. 3l illustrates the result application of solder mask to regions such as the I/O vias, and the application of a thick layer or post of thermally conductive material through the large aperture to the upper surface of thin metallization.

FIG. 4a is a simplified cross-sectional diagram of a structure similar to that of FIG. 3l or 3m, in which the overlapping film or dielectric portions are designated as "wings," and FIG. 4b illustrates the structure of FIG. 4a, with the addition of solderable material or metal over the thick metal post and I/O pad;

FIG. 5 illustrates how thermal and electrical connections are made to the structure of FIG. 4b;

FIG. 8 is a simplified cross-sectional diagram of another arrangement according to an aspect of the invention, similar to that of FIG. 7, in which an upper thermal shim is soldered to a thermal shim, which is in turn attached to an upper heat spreader.

DESCRIPTION OF THE INVENTION

Figure 1:
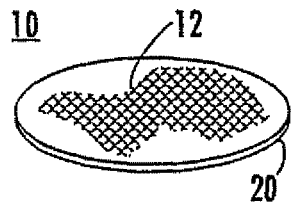
FIG. 1 is a simplified perspective or isometric view of a semiconductor wafer bearing a number of diffused or implanted semiconductor devices.
Figure 2:
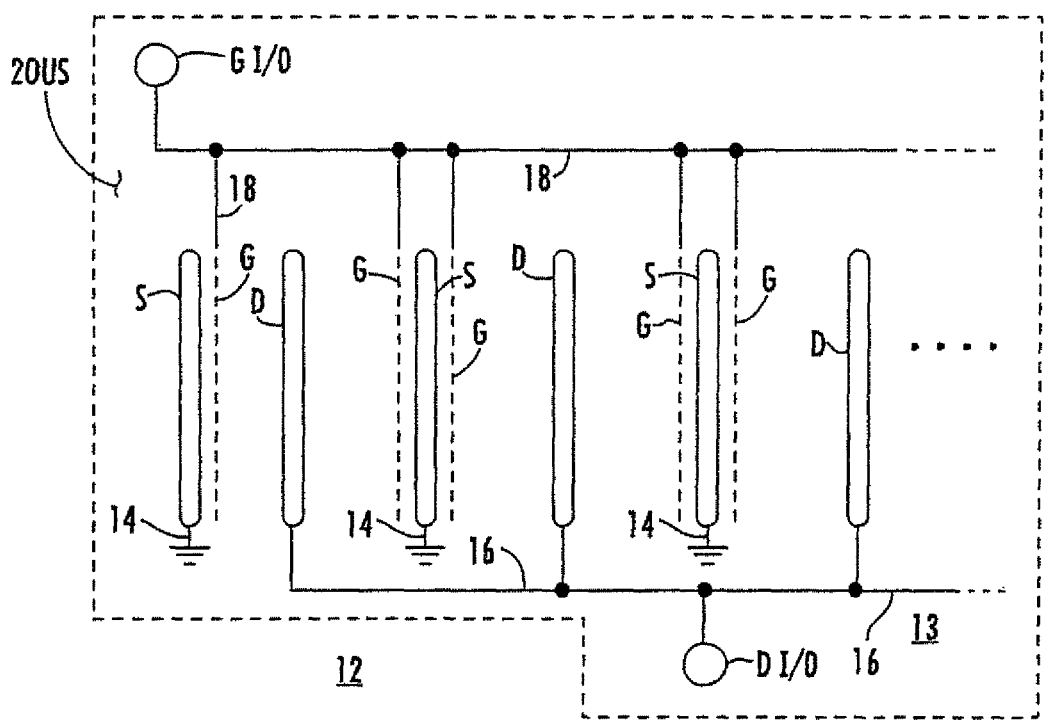
FIG. 2 is a simplified plan view of a single semiconductor device of FIG. 1 showing the active portions of a FET of FIG. 1 with a representation of electrical connections.
Figure 3A:
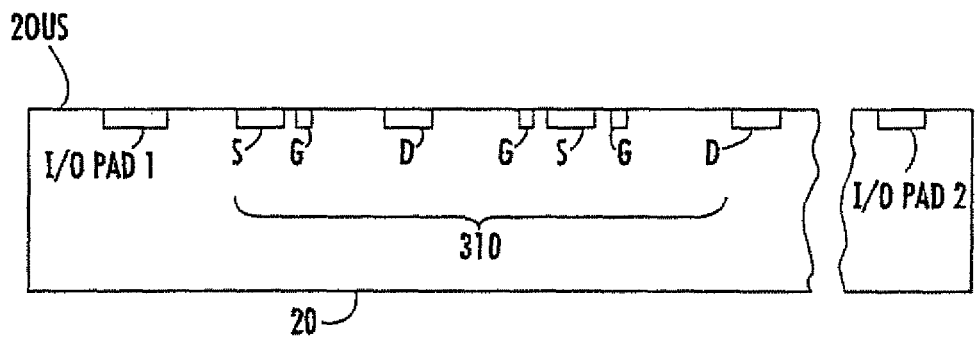
FIG. 3a is a simplified cross-sectional view of a portion of the structure of FIG. 2.

FIG. 1 illustrates a semiconductor wafer 10 defining an array of diffused, implanted, or otherwise formed semiconductor devices, one of which is designated 12. The substrate of wafer 10 is designated 20. FIG. 2 illustrates a plan view of a semiconductor device 12 of wafer 10, in the form of a field-effect transistor defining elongated, mutually parallel source (S), gate (G), and drain (D) electrodes lying on the upper surface 20us of semiconductor substrate 20. As illustrated in FIG. 2, the gate G electrodes are connected together and to a gate input/output (G I/O) terminal or electrode by an interconnection electrical conductor 18 which lies on the upper surface 20us of the semiconductor wafer 10. Also in FIG. 2, the drain electrodes D are electrically interconnected with each other and with a drain D I/O terminal or electrode by an interconnection electrical conductor 16 which lies on the upper surface 20us of the semiconductor wafer 10. FIG. 3a is a simplified cross-section of the structure of FIG. 2, illustrating the various I/O regions, and the source S, gate G, and drain regions relative to the substrate 20. A representative portion of the active FET, which is to say a portion of the structure containing source, gate, and drain electrodes, is designated as 310. The active portion of the entire FET includes all the source, gate, and drain electrodes. As can be seen in FIG. 3a, a gate (G) region lies between mutually adjacent source (S) and drain (D) regions, regardless of the order in which the source and drain regions appear. This arrangement tends to maximize the utilization of the semiconductor material. Also, the gate region is located closer to the adjacent source than to the adjacent drain.

Figure 3B:
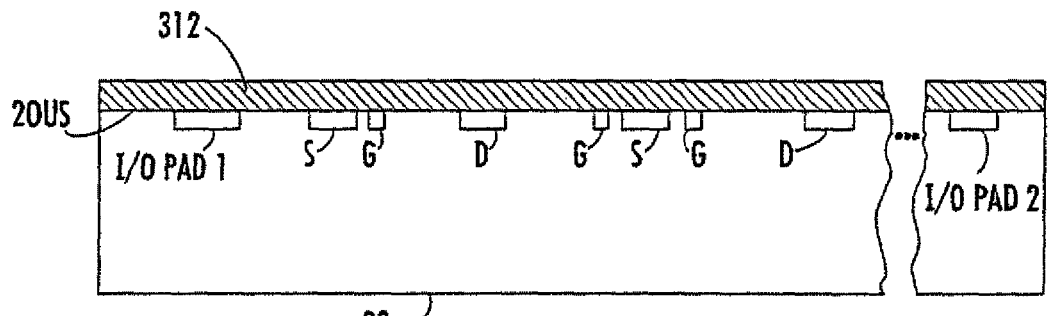
FIG. 3b illustrates the structure of FIG. 3a with the addition of a layer of metallization overlying the active portions.
Figure 3C:
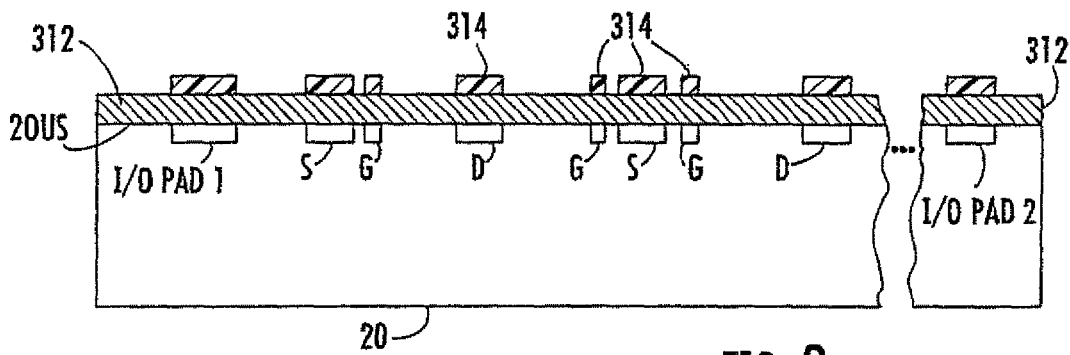
FIG. 3c is a simplified view similar to that of FIG. 3b, with the addition of a patterned layer of resist material overlying certain portions of the FET.
Figure 3D:
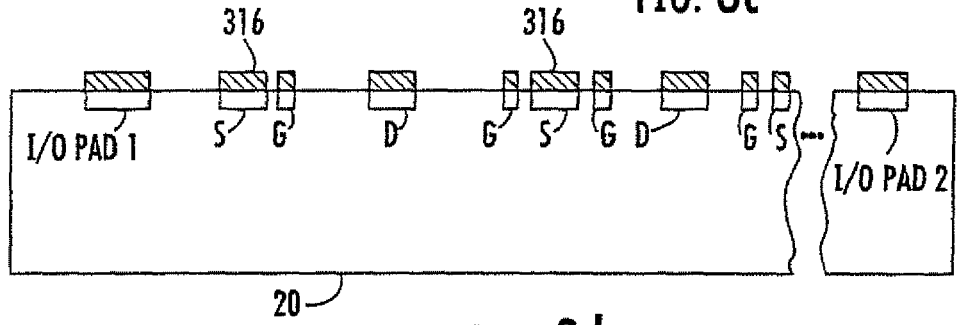
FIG. 3d illustrates the cross-section of FIG. 3c showing the metal pattern after etching and removal of the resist.

FIG. 3b illustrates the structure of FIG. 3a with the addition of a layer 312 of conductor such as metal overlying the upper surface 20us of the substrate 20 and also overlying the locations of the I/O, S, G, and D regions. FIG. 3c illustrates the application of a patterned layer 314 of resist material overlying those portions of the metallization 312 which are to remain in place. In particular, the resist overlies the input/output regions, and the source, gate, and drain regions. After application of the resist, an etchant is applied to the surface, including the exposed metallization 312 surface, and the etchant removes the exposed metallization. After cleaning the etchant from the surface and removing the resist material, a patterned metallization 316 is left on the surface 20us of substrate 20, as illustrated in FIG. 3d. In FIG. 3d, the metallizations overlie the input/output regions, and the source S, gate G, and drain D regions. While not explicitly indicated in FIG. 3d, the metallization also overlies the interconnection lines 16 and 18 of FIG. 2. The addition of the metallization provides ohmic electrodes by which electrical contact can be made to the various doped S, G, D, and I/O regions of the FET. In FIG. 3d, the metallizations 316 provide only limited interconnections, as for example between the gate electrodes and the gate I/O pad and between the drains and the drain I/O pad as illustrated in FIG. 2. Source connections can be made to ground in known fashion. The state of the chip 20 in FIG. 3d is the state in which the chip will ordinarily be received from the chip foundry.

Figure 3E:
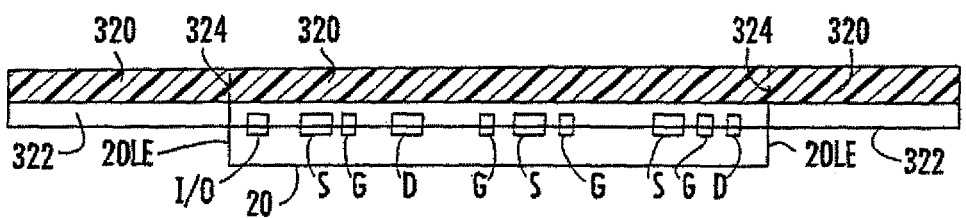
FIG. 3e illustrates the application of a layer of polymer or dielectric film over at least the upper surface of the FET of FIG. 3d.

FIG. 3e illustrates the application of a layer 320 of polymer or dielectric film over at least the upper surface of chip 20, held in place by a layer 322 of adhesive. The layer 320 of dielectric film may extend beyond the lateral edges 20le of chip 20, or the layer 320 of dielectric film may end in generally the same plane as the lateral edges 20le as suggested by dashed lines 324. Thus, in some embodiments, the layer 320 of polymer or dielectric extends beyond the lateral edges 20le of chip 20.

Figure 3F:
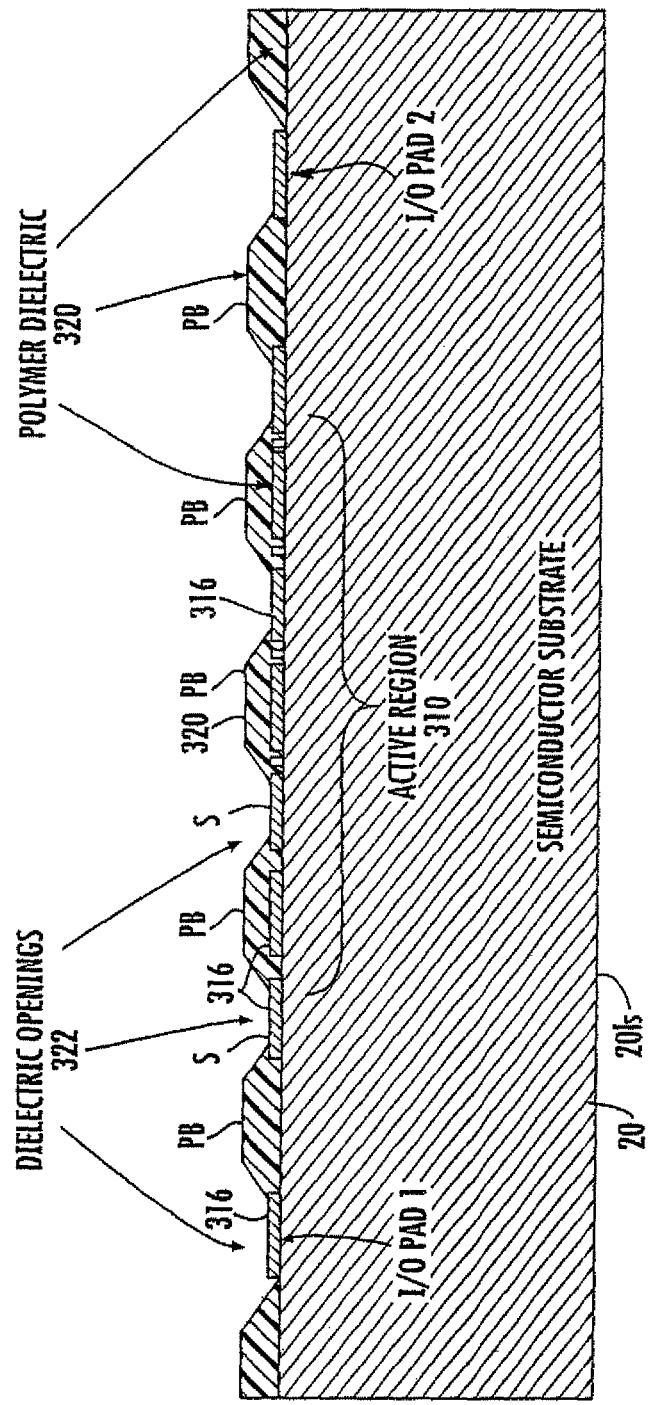
FIG. 3f illustrates the patterning of the dielectric material over most portions of the upper surface of the structure of FIG. 3e to form dielectric humps.

FIG. 3f illustrates the patterning of the polymeric dielectric material 320 over most portions of the upper surface of the structure of FIG. 3e except those dielectric openings or portions 322 in which the I/O pads and the source S metallizations 316 are located. The patterned dielectric material 320 forms polymer or dielectric bridges (PBs) extending between source S metallizations or electrodes 316. The polymer bridges are eventually metallized to form conductive bridges between the source metallizations. Those skilled in the microwave arts know that the presence of a dielectric material overlying the gate and drain electrodes tends to adversely increase undesirable capacitance and also introduces ohmic (dissipative) losses. This effect is ameliorated by use of a low dielectric constant, low loss dielectric material, and by making the dielectric bridge relatively thick to minimize coupling of the gate and drain signals to the source.

Figure 3G:
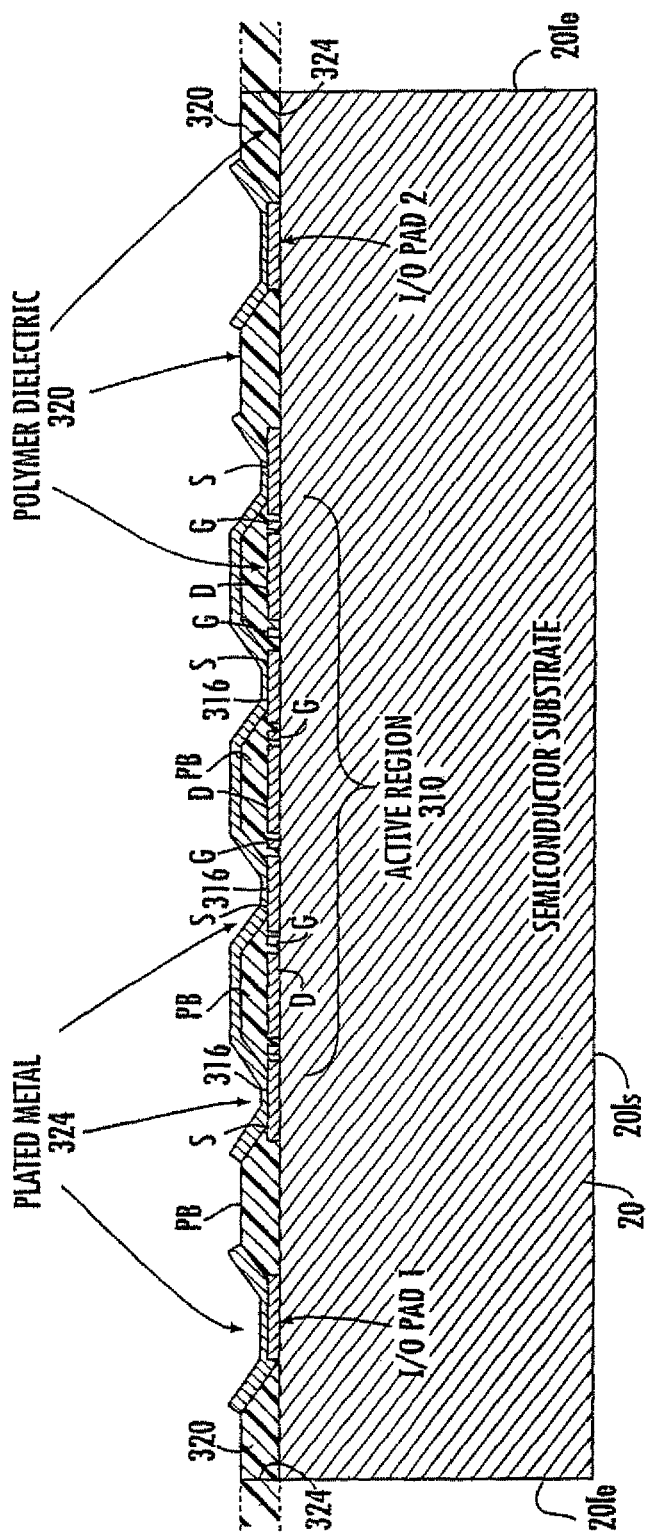
FIG. 3g illustrates the result of application of a thin layer of metal over the dielectric humps of FIG. 3f to define conductive bridges.
Figure 3H:
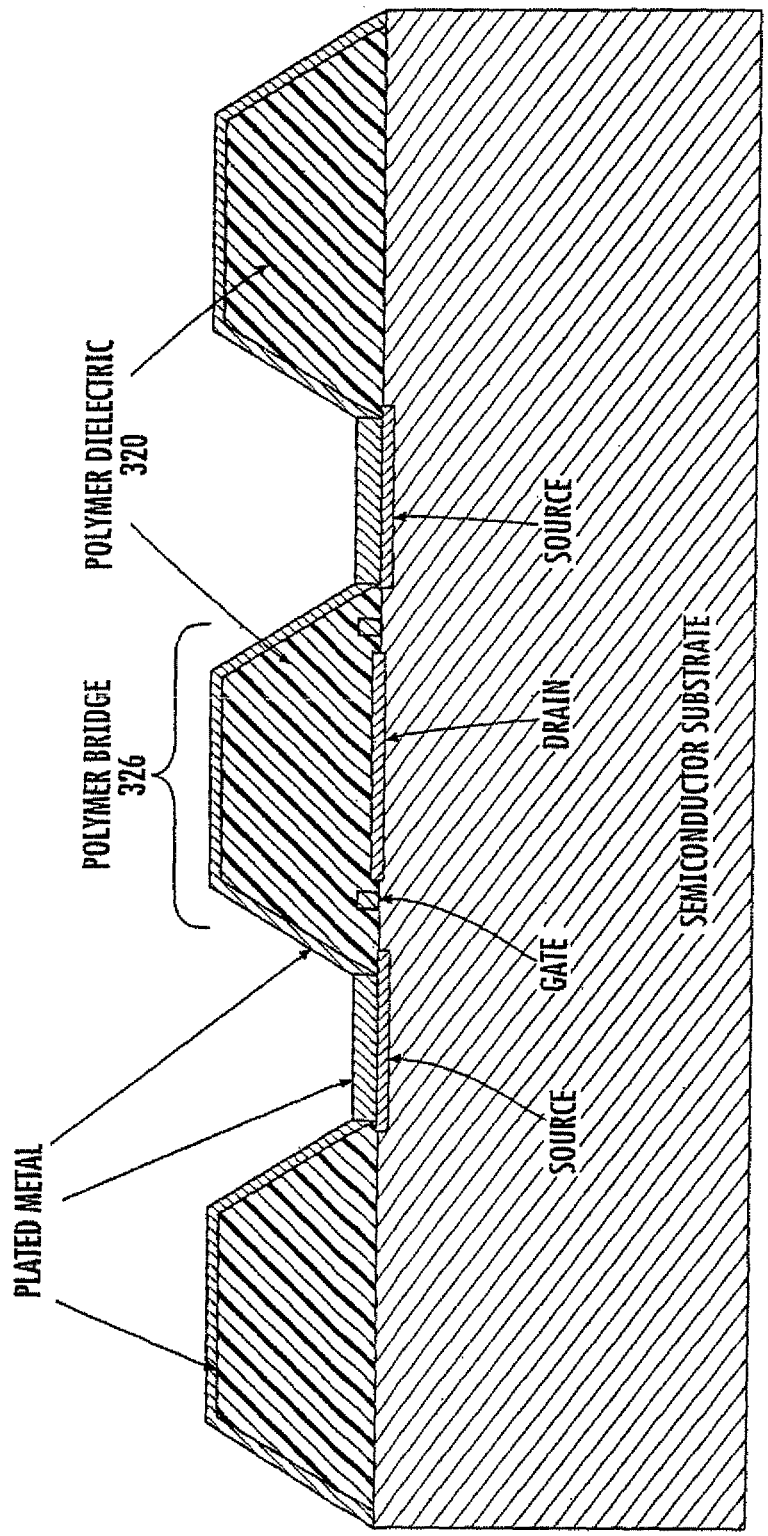
FIG. 3h is a detail of the FET of FIG. 3f.

FIG. 3g illustrates the structure of FIG. 3f with the addition of a thin layer of conductive material or metallization (plated metal) 324 to the upper surface of the dielectric or polymer bridge portions PB of patterned dielectric or polymer 320, to the source metallizations 316, and to the I/O pads. The metal, typically gold (Au), is applied, as by sputtering, to a thickness of 1 to 4 microns over the dielectric bridges 320. This metallization layer interconnects the sources S of the FET by way of the dielectric or polymer bridges PB. Note that the source connections do not extend to the I/O pads, as the metallization 324 is not continuous therebetween. The sources may continue to be connected to ground by other means, if desired. FIG. 3h is a detail of a portion of FIG. 3g, showing a plated or metallized polymer bridge as 326.

Figure 3I:
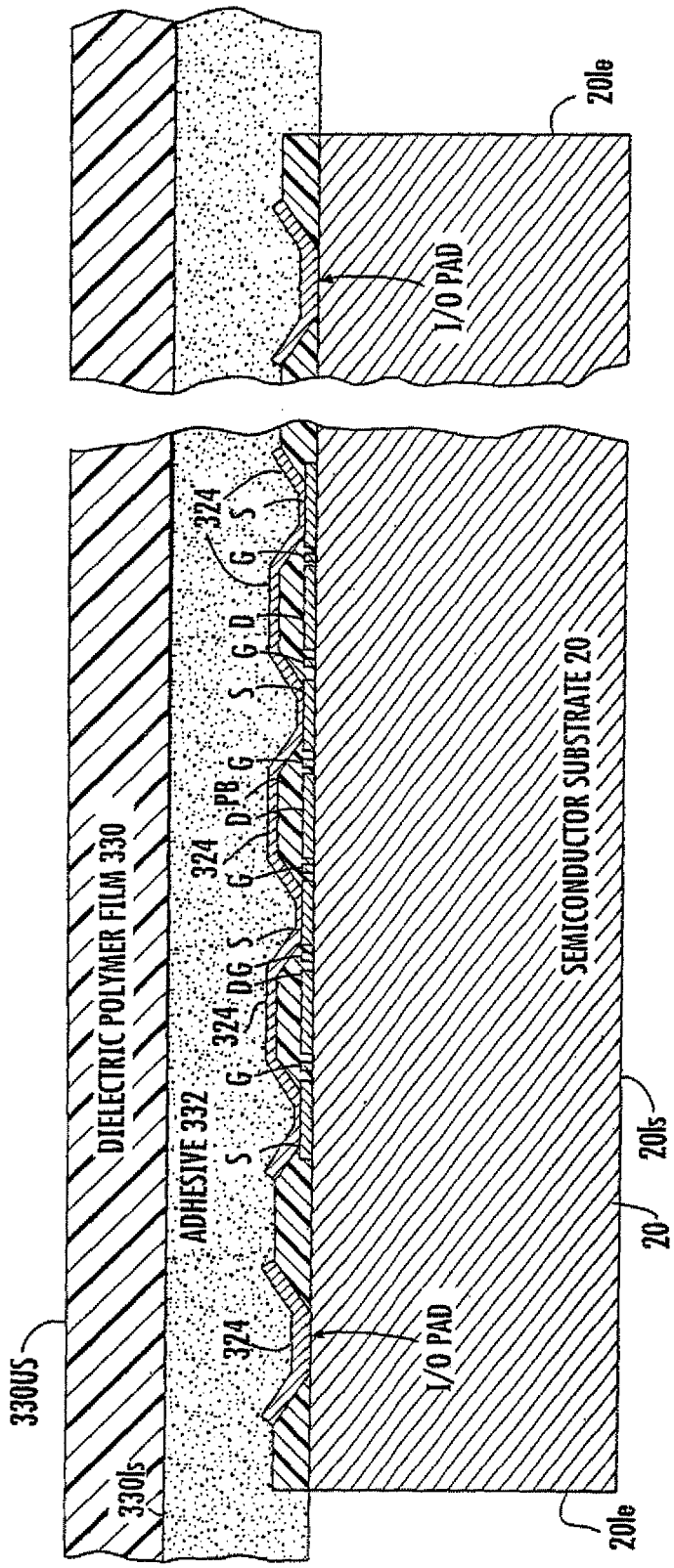
FIG. 3i illustrates the structure of FIG. 3f with the application to the upper or active side of the FET of a layer of polymer film coated with adhesive.
Figure 3J:
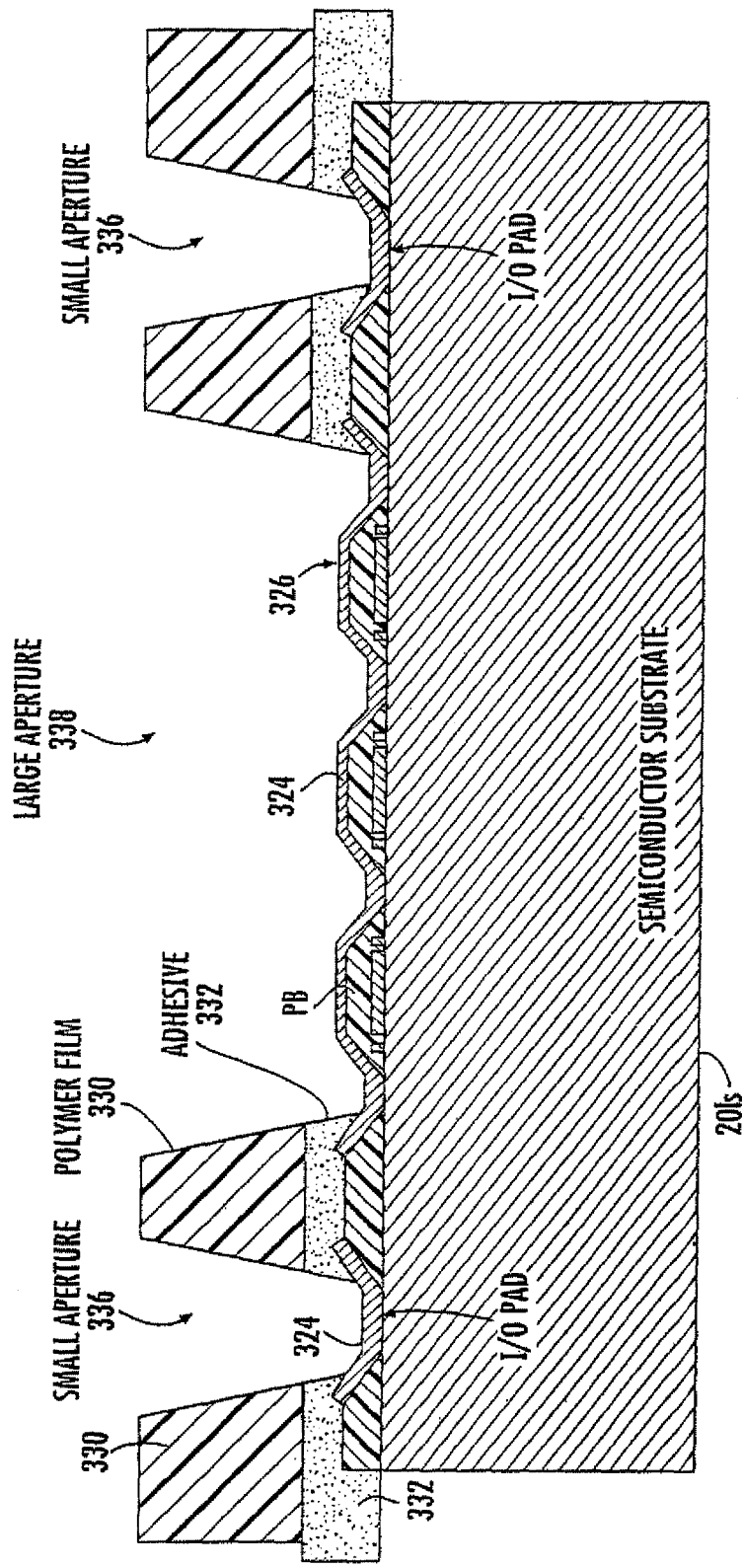
FIG. 3j illustrates the structure of FIG. 3h with the polymer film and adhesive removed over portions of the structure of FIG. 3g.

FIG. 3i illustrates the structure of FIG. 3g or 3h with the application to the upper or active side of the FET of a further layer of polymer film 330 coated with adhesive 332. As suggested in FIG. 3i, the polymer film 330 and its adhesive 332 may extend beyond the lateral edges 20le of the chip 20. FIG. 3j illustrates the structure of FIG. 3i with portions of the polymer film 330 and adhesive 332 removed, as by chemical or laser etching, to define, through the polymer film 330 and adhesive 332, small apertures or vias such as 336 over small features of the FET such as the I/O pads, and so as to define one or more large apertures or vias such as 338 over the exposed portion of metal layer 324.

Figure 3K:
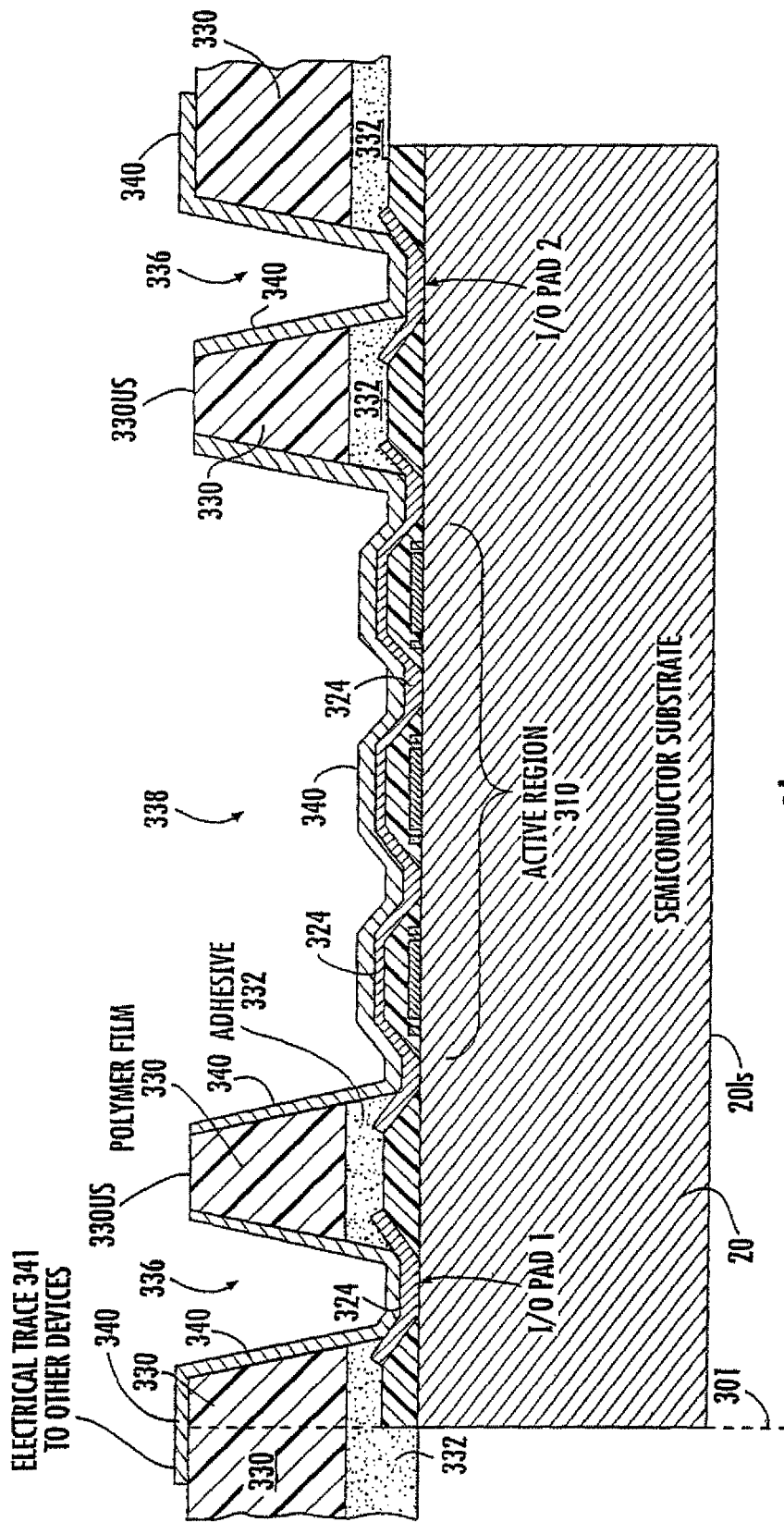
FIG. 3k illustrates the result of application of a further patterned thin layer of metal extending over the thin metallization in a large and small aperture of FIG. 3j.
Figure 3I:
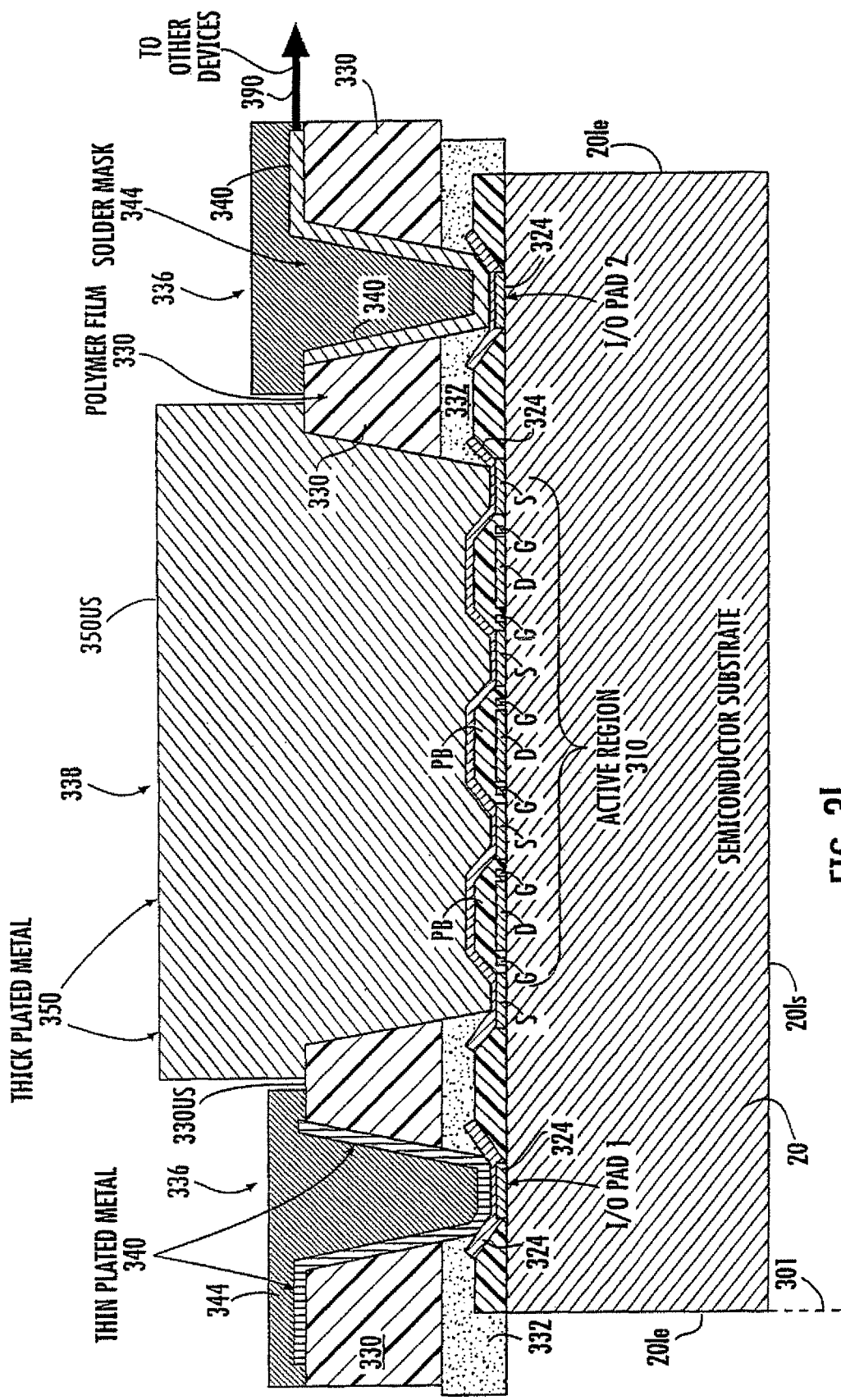

FIG. 3k illustrates the result of application of a further patterned thin layer 340 of metal extending over the thin metallization 324 in the large aperture(s) 338 and the small aperture(s) 336. This layer 340 extends, at least in part, over the upper surface 330us of polymer film 330, to thereby define accessible input/output pads for external connections. A solder mask 344 may be applied through the small apertures 336 to regions such as the I/O vias as illustrated in FIG. 3l. As illustrated in FIG. 3k, a portion, designated 341, of the layer 340 of metal which is in contact with I/O pad 1 extends past the footprint of the semiconductor substrate 20, indicated by dash line 301, and may be used to connect I/O pad 1 to some device other than the FET associated with active region 310.

Following the step of application of a solder mask to the small apertures 336 described in conjunction with FIG. 3l, a thick layer or post 350 of thermally conductive material is applied through the large aperture 338 (FIG. 3k) to the upper surface of thin metallization 340, and built up to a thickness which allows thermal access to the upper surface 350us of the thick metal "post" 350, as shown in FIG. 3l. The structure as described in conjunction with FIG. 3l allows heat to be extracted from the active region of the semiconductor by two different paths, namely the usual downward path extending from the active region 310 to the lower surface 20ls of the semiconductor chip or substrate 20, and also by an upward path extending from the active region 310 upward through metallization layers 324 and 340, and thick metal layer 350 to the upper surface 350us of thick metal layer 350. The term "upward," and other terms indicative of direction or orientation, should be understood to refer to the illustrations, and to not necessarily relate to the corresponding direction or orientation of the thing(s) depicted. Another advantage of the arrangement of FIG. 3l is that the thermal resistance of the material of plated metal post 350 is likely to be lower than the thermal resistance of the material of the semiconductor substrate 20, since the characteristics of the substrate are likely to be dominated by electrical conductivity considerations. In FIG. 3l a portion of layer 340 of metal extends to the right over dielectric film 330 past the right edge 20le of the semiconductor substrate 20, and therefore past its footprint. This conductor may extend to a remote device to provide electrical connectivity between the remote device and I/O pad 2.

Another advantage of the arrangement of FIG. 3l when the layers of polymer extend to the right and/or to the left beyond the lateral edges 20le of the substrate 20 is that electrical connections can be made to the to I/O pads 324 of the active device from remote locations by means of conductive layer(s) 340.

Figure 3M:
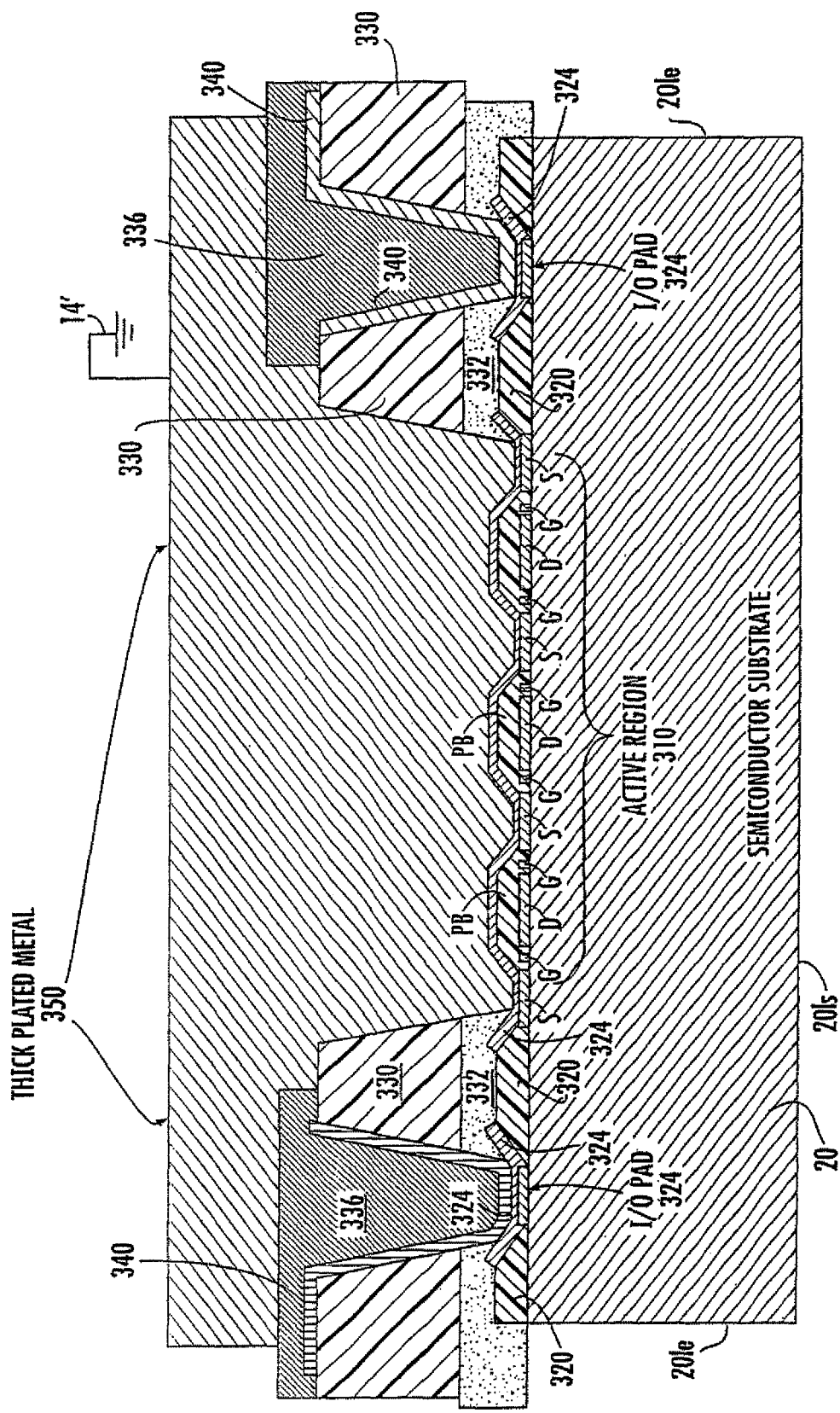
FIG. 3m represents an alternative application of the thick metal into the aperture of FIG. 3k by comparison with the arrangement of FIG. 3l.

FIG. 3m represents an alternative application of the thick metal 350 into the aperture 338 of FIG. 3k by comparison with FIG. 3l In FIG. 3m, the thick metal 350 extends no only over the active region 310 as in FIG. 3l, but also over a region extending outward from aperture 338, to thereby provide a spreading of heat transferred upward from the active region 310 away from the region directly over the active portions of the FET. The heat transfer downward is through the semiconductor substrate, and is spread only to the extent of the dimensions of the substrate. The arrangement of FIG. 3m has the same advantage as the arrangement of FIG. 3l in that electrical connections can be made from remote locations to the active device by means of conductive layer(s) 340.

FIG. 4a is a simplified cross-sectional diagram of a structure similar to that of FIG. 3l or 3m, in which the overlapping film or dielectric portions are designated as "wings" 460. In FIG. 4a, a thick metal I/O pad 450 is applied or grown on a portion of conductive layer 340 remote from the actual I/O pad 324 of the semiconductor substrate 20. FIG. 4b illustrates the structure of FIG. 4a, with the addition of solderable material or metal 452 over the thick metal post 350 and the thick metal I/O pad 450.

FIG. 5 illustrates how thermal and electrical connections are made to the structure of FIG. 4b. In FIG. 5, the semiconductor substrate, film layers, and metal post(s) of FIG. 4b are turned upside down (although the orientation continues to be irrelevant) for juxtaposing the I/O metal post 450 with electrical connections 508 on the upper surface of an interconnect substrate 510 and also juxtaposing the thick metal post 450 with a heat or thermal "sink" 520. When so juxtaposed, the solderable metal 452 is fused to make the appropriate electrical and thermal attachments to the substrate 510 and the heat sink 520, respectively.

Figure 6:
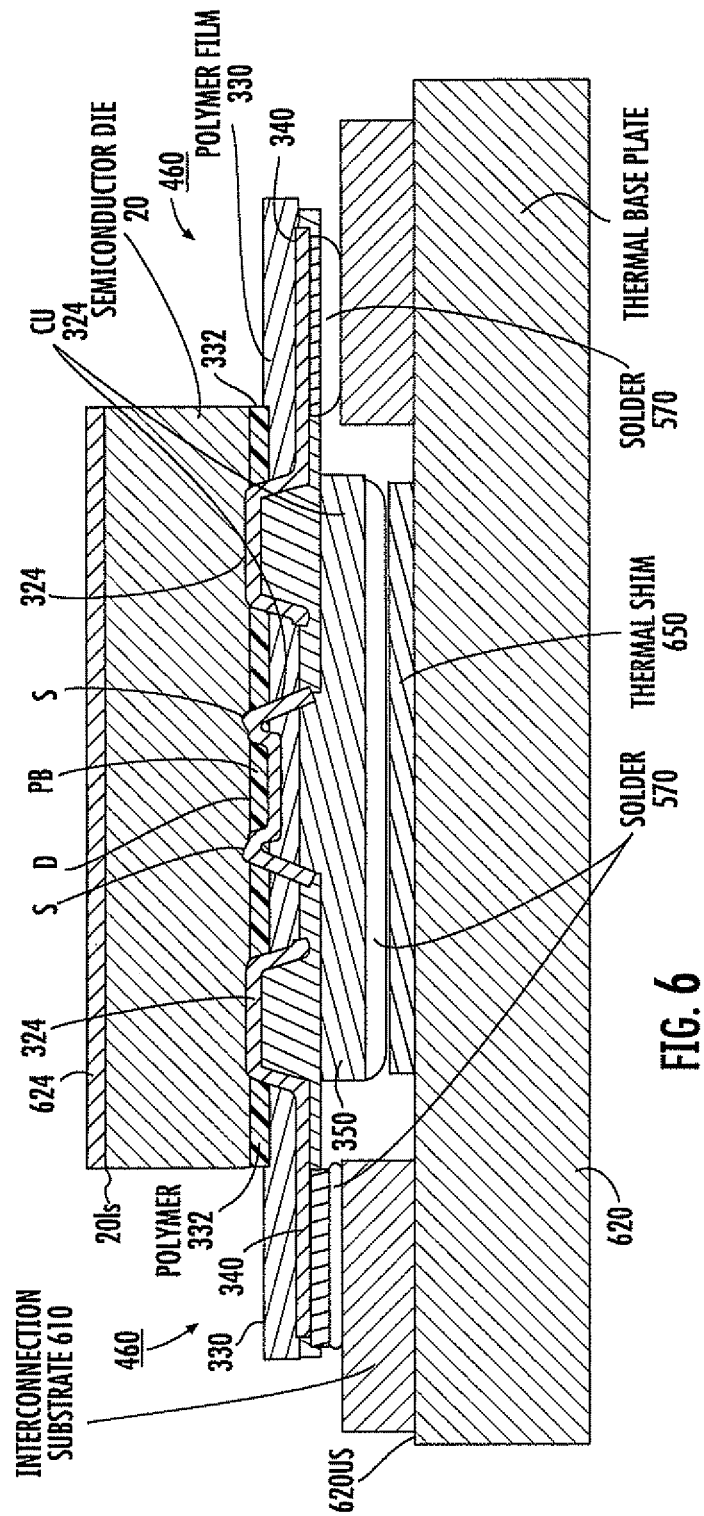
FIG. 6 illustrates an alternative arrangement according to an aspect of the invention, in which the interconnection substrate is mounted on the upper surface of a thermal base plate.

FIG. 6 illustrates an alternative arrangement according to an aspect of the invention, in which the interconnection substrate 610 is mounted on the upper surface 620us of a thermal base plate 620. In FIG. 6, the semiconductor die or substrate is designated 20, and its surface 20ls is coated with a layer 624 of conductive metal, designated as copper, to aid in making thermal connections in the upward direction. Only one drain D, and two source S electrodes are shown in FIG. 6. Layer 332 of polymer film is patterned to form bridge(s) PB between the sources S, and a layer 324 of thin conductor lies over the bridge(s). Layer 324 may be thickened by metal layer 344 (not separately visible in FIG. 6). The layer 324/344 of metal also overlies the input/output (I/O) pads, and extends onto and over the polymer layer 330 in the wings 460 region. As illustrated in FIG. 6, the interconnect layer 324 extending onto the wing region 460 is soldered 570 to conductors on the upper surface(s) of interconnection substrate 610, from whence the connections may extend to other devices as may be required. A thermal shim 650 is interposed between the thick metal post 350 and the thermal baseplate 620, and is soldered 570 thereto for good thermal connectivity. The interconnection substrate 610 extends over at least the illustrated portion of the thermal substrate 620.

Figure 7:
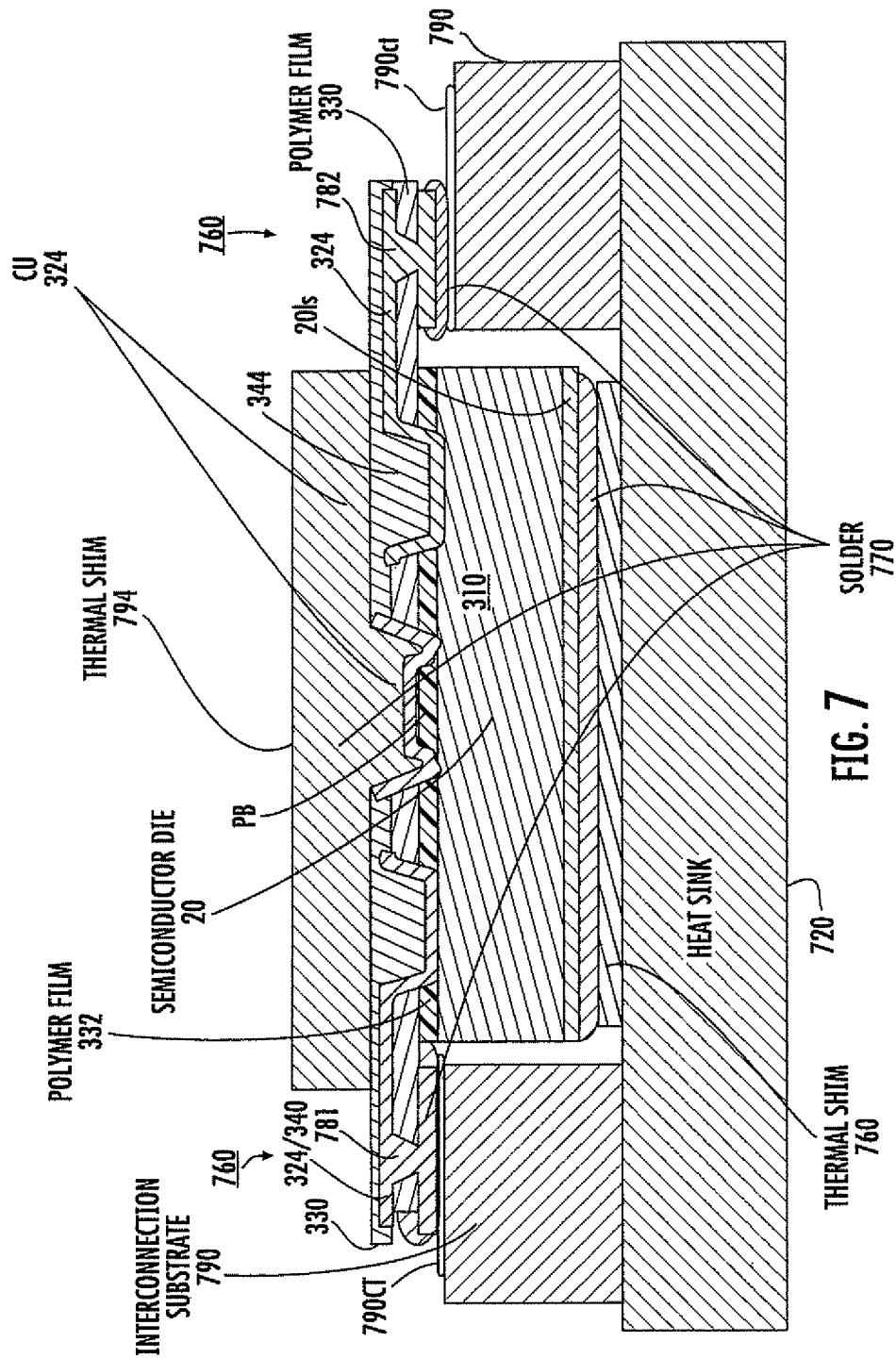
FIG. 7 illustrates another arrangement according to an aspect of the invention, in which the semiconductor die has its lower surface thermally connected by way of a thermal shim to a heat sink.

FIG. 7 illustrates another arrangement according to an aspect of the invention. In FIG. 7, the semiconductor die 20 has its lower surface 20ls thermally connected by way of a thermal shim 760 to a heat sink 720. The upper surface 20us is overlain by a layer 332 of polymer film, which is patterned to define a polymer bridge (PB). The polymer bridge is overlain by a layer 324 (possibly including layer 340) of metallization, designated as being copper (Cu). The layer 324 of metal defines the conductive bridge extending between the two illustrated source (S) regions, and also independently connects to the I/O regions. The conductive layer 324/340 extends over a wing 760 portion of the polymer layer 330 on both the left and on the right of the FIGURE. First and second conductive through vias 781, 782 extend through polymer layer 330 to make contact with corresponding solder regions 770, for making connections to conductive traces 790CT overlying a substrate 790. Substrate 790, in turn, overlies a portion of the upper surface of heat sink 720. A thermal shim illustrated as 794 extends above and connects thereto, for carrying heat away from the active portion of the semiconductor die 20.

FIG. 8 is a simplified cross-sectional diagram of another arrangement according to an aspect of the invention. The arrangement of FIG. 8 is similar to that of FIG. 7, and corresponding elements are designated by the same reference numerals. In FIG. 8, the arrangement of FIG. 7 has its upper thermal shim 794 soldered (770) to a thermal shim 894, which is attached to an upper heat spreader 820. Thus, the active portion 310 of the semiconductor die 20 can transfer heat downward through the semiconductor die 20, thorough thermal shim 760 to heat sink 720, and can also transfer heat upward through the metallized "air" bridges and other upper structures, through metal post 350, solder 770, and thermal shim 894 to upper heat spreader 820.

A mode of a method according to an aspect of the invention is for making a microwave power device (12). The mode includes the step of procuring a microwave FET (13) including an active surface (20us) bearing at least a gate (G) electrode, a drain (D) electrode, and at least first and second source (S) electrodes separated by gate (G) and drain (D) electrodes. An electrically conductive bridge (326) is thermally and electrically connected to the source (S) electrodes, and extends over, but does not electrically contact, the gate (G) or drain (D) electrodes. This provides electrical communication between the first and second source (S) electrodes. A sheet of dielectric (330) material defining first (330ls) and second (330us) broad sides is procured. The active side (20us) of the FET (13) is affixed to the first broad side (330ls) of the dielectric (330) sheet, with the electrically conductive bridge (326) facing the first broad side (330ls) of the sheet of dielectric (330) material. An electrically and thermally conductive through via (350) is defined, extending through the dielectric (330) sheet at least over the bridge (326). The through via (350) makes electrical and thermal contact with at least the bridge (326), to produce electrical contacts adjacent or on the second side (330us) of the dielectric (330) sheet providing access to, or accessing, the source (S) electrodes of the FET (13), and also providing a thermal path from the bridge (326) to the second side (330us) of the dielectric (330) sheet.

In a particular version of the mode of the method, the step of making a bridge (326) includes the step of applying dielectric (320) material to the active surface (20us) of the device at a location lying between the first and second source (S) electrodes, and applying a metal (324) to the upper surface of the dielectric (320) material. The step of applying dielectric (320) material to the active surface (20us) of the device at a location lying between the first and second source (S) electrodes may include the step of applying the dielectric (320) material over at least a portion of the gate (G) and drain (D) electrodes.

In another mode of a method according to the invention, the device further comprises gate (G) and drain (D) electrodes, and the gate (G) and drain (D) electrodes are connected to gate (G) and drain (D) input/output (I/O) electrodes, respectively, by conductive traces (16, 18) lying on the active surface (20us) of the device. In this mode, the step of affixing the active side of the FET (13) to the first broad side (330ls) of the dielectric (330) sheet includes the step of affixing the active side (20us) of the FET (13) to the first broad side (330ls) of the dielectric (330) sheet with the dielectric (330) sheet overlying the gate (G) and drain (D) input/output (I/O) electrodes. The mode further comprises the step of defining an electrically and thermally conductive additional through via (336) extending through the dielectric (330) sheet at least over one of the gate (G) and drain (D) input/output (I/O) electrodes, for providing electrical contact to at least one input/output (I/O) electrode.

Following the step of defining an electrically and thermally conductive additional through via (336) extending through the dielectric (330) sheet at least over one of the gate (G) and drain (D) input/output (I/O) electrodes, a layer of resist, such as solder resist or mask (344), may be applied over at least the additional through via (336).

The step of defining an electrically and thermally conductive through via (350) extending through the dielectric (330) sheet at least over the bridge (326) may include the further step of defining a through aperture (338) extending from the first (330ls) to the second side (330us) of the dielectric (330) sheet, at least over the bridge (326), and plating metal (340, 350) onto the bridge (326). The plating of metal onto the bridge may be accompanied by plating also onto the resist material (344) overlying the additional through via (336). The step of plating metal (340, 350) may be performed until the resulting plated metal extends above the second broad surface (330us) of the dielectric (330) sheet.

The method may include the additional step of making electrical contact on the second broad side (330us) of the dielectric (33.0) sheet between the additional through via (336) and a device other than the microwave power device (by way of 390 extension of 340).

The step of defining an electrically and thermally conductive through via (350) extending through the dielectric (330) sheet at least over the bridge (326) may include the step of defining an aperture (338) extending through the dielectric (330) sheet at least over the bridge (326), and plating metal (340, 350) through the aperture (338) onto the conductive bridge (326).

In a particularly advantageous method according to an aspect of the invention, an exposed surface (350us) of the electrically and thermally conductive through via (350) is thermally coupled to a heat sink (620). In an even more advantageous mode of the method, the inactive surface (20ls) is thermally coupled to a further heat sink (720).

A microwave circuit package (12) according to an aspect of the invention comprises a microwave device (13) having an active top surface (20us) and a non-active bottom surface (20ls). The active top surface (20us) includes plural source (S) electrodes, plural gate (G) electrodes mutually electrically interconnected by gate (G) connection conductors (18) lying on the active top surface (20us), and plural drain (D) electrodes mutually electrically interconnected by drain (D) connection conductors (16) lying on the active top surface (20us). The package (12) also includes a plurality of electrically conductive bridges (326) physically and electrically fastened to, and electrically interconnecting the plural source (S) electrodes. The bridges (326) are electrically isolated from the gate (G) and drain (D) interconnection conductors (16, 18) and extend above the active top surface (20us). A layer of dielectric (330) film extends over at least that portion of the circuit package including the plurality of electrically conductive bridges (326) and is physically connected to the circuit package (12). A thermally conductive through via (350) extends through the layer of dielectric (330) film at the locations of at least some of the electrically conductive bridges (326), whereby heat can be extracted from the circuit package by way of the thermally conductive via (350). The thermally conductive through via (350) may also be electrically conductive.

In a circuit package (12) further comprising gate (G) and drain (D) input/output (I/O) electrodes electrically connected to the gate (G) connection conductors and drain (D) connection conductors, respectively, the additional electrically conductive through via(s) (336) extend through the layer of dielectric (330) film at locations overlying the gate (G) and drain (D) input/output (I/O) electrodes, and make electrical connection thereto. The package (12) may further comprise an electrical trace (341) electrically connected to at least one of the gate (G) and drain (D) input/output (I/O) electrodes and extending over a portion of the dielectric (330) film to a location remote from the footprint of the microwave device.

What is claimed is:

1. A microwave circuit package comprising:
a microwave device, comprising a field effect transistor (FET) defined in a wide band gap semiconductor material having an active top surface and a non-active bottom surface, said active top surface including plural source electrodes, plural gate electrodes mutually electrically interconnected by gate connection conductors lying on said active top surface, and plural drain electrodes mutually electrically interconnected by drain connection conductors lying on said active top surface;
a plurality of solid dielectric bridges covering said gate interconnection conductors and drain interconnection conductors, said dielectric bridges covering said gate interconnection conductors and drain interconnection conductors coated with and contacting a layer of electrically conductive material at locations covering said gate interconnection conductors and drain interconnection conductors, electrically interconnecting said plural source electrodes, said bridges electrically isolating said layer of electrically conductive material from said gate interconnection conductors and drain interconnection conductors and extending above said active top surface;
a layer of dielectric film extending over at least that portion of said circuit package including said plurality of bridges coated with said layer of electrically conductive material and physically connected to said circuit package;
a thermally conductive through via defined through said layer of dielectric film, said through via configured to expose an area defining said dielectric bridges coated with and contacting said layer of electrically conductive material, including areas of said gate interconnection conductors, said drain interconnection conductors, and said interconnected plural source electrodes, said through via being covered by a thermally conductive layer; and
a thick plate metal post defined in said thermally conductive through via extending through said layer of dielectric film at the locations of at least some of said dielectric bridges covering said gate interconnection conductors and drain interconnection conductors coated with and contacting said layer of electrically conductive material, said thick plate metal post thermally contacting said conductive material coating and contacting said dielectric bridges and having an upper surface that extends above any other components of the microwave circuit package.

2. A circuit package according to claim 1, wherein said thermally conductive through via is also electrically conductive.

3. A circuit package according to claim 1, further comprising gate and drain input/output electrodes electrically connected to said gate connection conductors and drain connection conductors, respectively; and further comprising:
   additional electrically conductive through vias extending through said layer of dielectric film at locations overlying said gate and drain input/output electrodes, and making electrical connection thereto.

4. A circuit package according to claim 3, further comprising an electrical trace electrically connected to at least one of said gate and drain input/output electrodes and extending over a portion of said dielectric film to a location remote from the footprint of said microwave device.

5. The microwave circuit package of claim 1, further comprising:
   a thick layer of thermally conductive material applied to said thermally conductive through via in contact with said layer of electrically conductive material.

6. The microwave circuit package of claim 1, further comprising:
   a thermally conductive shim in thermal contact with an upper surface of said thick plate metal post, said thermally conductive shim configured to provide thermal connectivity between a heat sink and said thick plate metal post.

7. The microwave circuit package of claim 1, wherein the upper surface of said thick plate metal post extends laterally beyond the active region and over a contact pad of the circuit package.

8. The microwave circuit package of claim 1 further comprising:
   at least one contact pad defined on an upper surface of said microwave device corresponding to said active top surface, said at least one contact pad connected to one of said gate interconnection conductor and said drain interconnect conductor, and located adjacent to a region defined by said active top surface, wherein said dielectric film extends over said at least one contact pad and contains thermally conductive through vias defined at locations of said at least one contact pad and said active upper surface of said microwave device.

9. The microwave circuit package of claim 8, wherein said thick plate metal post covers said upper active surface and extends outward from said upper active surface over said at least one contact pad to define a surface opposite said active upper surface having an area larger than an area of said upper active surface of said microwave device.

10. The microwave circuit package of claim 1, wherein said FET is defined from a semiconductor material comprising Gallium Nitride (GaN).

11. The microwave circuit package of claim 1, wherein said FET is defined from a semiconductor material comprising silicon carbide (SiC).

12. A circuit package comprising:
   a wide band gap semiconductor device having an active surface including plural electrodes;
   a plurality of electrically conductive bridges interconnecting a plurality of source electrodes of said plural electrodes, each of said electrically conductive bridges comprising:
   a solid dielectric layer configured to cover at least one gate electrode and at least one drain electrode of said plural electrodes;
   a conductive layer coating and in contact with said dielectric layer at locations of each gate electrode and each drain electrode and forming an electrical connection between each of the plurality of source electrodes;
   a layer of dielectric film extending over at least a portion of said circuit package including said plurality of electrically conductive bridges;
   a thermally conductive through via defined through said layer of dielectric film, said through via configured to expose and area containing said dielectric bridges coated with and contacting said layer of electrically conductive material, including areas of said at least one gate electrode, said at least one drain electrode, and said interconnected plurality of source electrodes, said through via being covered by a thermally conductive layer; and
   a thick plate metal post defined in said thermally conductive through via extending through said layer of dielectric film at a location of at least one of said electrically conductive bridges, said thick plate metal post thermally contacting said conductive layer and having an upper surface that extends above any other component of the circuit package.

13. A circuit package according to claim 12, wherein said thermally conductive through via is also electrically conductive.

14. A circuit package according to claim 12, further comprising:
   an input/output electrode adjacent to a region defined by said gate interconnection conductor, said drain interconnect conductor and said plural source electrodes; and
   another thermally conductive through via extending through said layer of dielectric film at a location of said input/output electrode.

15. A circuit package according to claim 14, wherein said another thermally conductive through via is also electrically conductive.

16. A circuit package according to claim 14, further comprising an electrical trace connected to said input/output electrode and extending over a portion of said dielectric film to a location remote from the footprint of said device.

17. The circuit package of claim 12 further comprising:
   a thick layer of thermally conductive material applied to said thermally conductive through via in contact with said layer of electrically conductive bridges.

18. A circuit package comprising:
   a wide band gap semiconductor device having an active surface including plural electrodes;
   an electrically conductive bridge interconnecting a plurality of source electrodes of said plural electrodes each of said electrically conductive bridges comprising:
   a solid dielectric layer configured to cover at least one gate electrode and at least one drain electrode of said plural electrodes;
   a conductive layer coating and in contact with said dielectric layer at locations of each gate electrode and each drain electrode and forming an electrical connection between each of the plurality of source electrodes;

a layer of dielectric film extending over at least a portion of said circuit package including said electrically conductive bridge;

a through via defined through said layer of dielectric film, said through via configured to expose said electrically conductive bridge including each said gate electrode, each said drain electrode, and said interconnected plurality of source electrodes, said through via being covered by a thermally conductive layer; and a thick plate metal post defining said thermally conductive through via extending through said layer of dielectric film at a location of said electrically conductive bridge, said thick plate metal post thermally contacting said conductive layer and having an upper surface that extends above any other component of said circuit package.

19. A circuit package according to claim 18, wherein said thermally conductive through via is also electrically conductive.

20. A circuit package according to claim 18, further comprising: an input/output electrode adjacent to a region defined by said at least one gate electrode, said at least one drain electrode and said plurality of source electrodes; and an electrical trace connected to said input/output electrode and extending over a portion of said dielectric film to a location remote from the footprint of said device.

21. The circuit package of claim 18, further comprising:
a thick layer of thermally conductive material applied to said thermally conductive through via in contact with said layer of electrically conductive bridges.

22. The circuit package of claim 18, wherein said active surface is substantially planar and corresponds to a field effect transistor (FET), a first input/output electrode electrically connected to said at least one gate electrode; a second input/output electrode electrically connected to said at least one drain electrode; said first and second input/output electrodes extend laterally from said FET, and said upper surface of said thick plate metal post extends laterally beyond said first and second input/output electrodes.

23. A circuit package comprising:
a wide band gap semiconductor device having an active surface including plural electrodes;
a solid dielectric bridge covering at least one gate electrode and at least one drain electrode of said plural electrodes, the dielectric bridge coated with a layer of electrically conductive material at locations covering said gate and drain electrodes and that interconnects a plurality of source electrodes of said plural electrodes; and
a layer of dielectric film extending over at least a portion of said circuit package;
a thermally conductive through via defined through said layer of dielectric film, said through via configured to expose areas containing said dielectric bridge coated with said layer of electrically conductive material, including areas of said gate and drain electrodes, and said interconnected plurality of source electrodes, said through via being covered by a thermally conductive layer; and a thick plate metal post defining said through via extending through said layer of dielectric film at a location of said bridge coated with said layer of electrically conductive material, said thick plate metal post thermally contacting said layer of electrically conductive material and having an upper surface that extends above any other component of the microwave circuit package.

24. The circuit package of claim 23, further comprising:
a thick layer of thermally conductive material applied to said thermally conductive through via and in contact with said layer of electrically conductive material.

25. A semiconductor device comprising:
a wide band gap semiconductor substrate having an active top surface and a second inactive surface opposite said active top surface;
a field effect transistor (FET) defining source, gate and drain electrodes lying on said active top surface;
a first patterned metallization layer overlaying areas defined by the source, gate and drain electrodes;
a patterned dielectric layer overlaying and in contact with the gate and drain electrodes and defining openings at the source electrodes, the patterned dielectric layer thereby forming solid dielectric bridges between the source electrodes;
a first thermally conductive layer overlaying and in contact with the patterned dielectric layer at locations covering the gate and drain electrodes, and further in contact with the source electrodes, the thermally conductive layer interconnecting the source electrodes;
a dielectric layer covering said active top surface and having defined there through a thermally conductive via, said thermally conductive via exposing an area containing said first patterned metallization layer overlaying areas defined by the source, gate and drain electrodes; and
a thick plate metal post thermally contacting said first thermally conductive layer through said thermally conductive via.

26. The semiconductor device of claim 25, further comprising:
a second patterned dielectric layer overlaying and contacting the first thermally conductive layer, and having through vias defined over the interconnected source electrodes, wherein said thick plate metal post defines said through vias defined over the interconnected source electrodes, said thick plate metal post having an upper surface that extends above any other component in said semiconductor device.

27. The semiconductor device of claim 26, wherein said thick plate metal post comprises an electrically conductive material.

\* \* \* \* \*